United States Patent [19]
Fujimura et al.

[11] Patent Number: 5,858,450
[45] Date of Patent: *Jan. 12, 1999

[54] FILM FORMING METHOD AND APPARATUS THEREFOR

[75] Inventors: Hidehiko Fujimura; Mitsuharu Sawamura, both of Yokohama; Makoto Kameyama, Funabashi; Akihiko Yokoyama, Yokohama, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 781,227

[22] Filed: Jan. 10, 1997

Related U.S. Application Data

[63] Continuation of Ser. No. 356,468, Dec. 15, 1994, abandoned.

[30] Foreign Application Priority Data

Dec. 17, 1993 [JP] Japan ................................ 5-344244

[51] Int. Cl.⁶ ...................................................... B05D 1/00
[52] U.S. Cl. ...................... 427/9; 118/712; 118/723 CB; 427/209; 427/248.1; 427/294; 427/523; 427/569
[58] Field of Search ................... 427/8, 9, 209, 427/523, 569, 248.1, 294; 118/723 CB, 712

[56] References Cited

U.S. PATENT DOCUMENTS

| | | | |
|---|---|---|---|
| 4,629,640 | 12/1986 | Akao | 428/35 |
| 4,687,939 | 8/1987 | Miyauchi et al. | 250/492.3 |
| 4,688,130 | 8/1987 | Nakanouchi et al. | 360/135 |
| 4,799,454 | 1/1989 | Ito | 427/523 |
| 4,882,023 | 11/1989 | Wendman | 204/192.31 |
| 5,079,224 | 1/1992 | Higuchi | 505/1 |
| 5,211,994 | 5/1993 | Tsukazaki et al. | 427/523 |
| 5,340,415 | 8/1994 | Koike et al. | 118/325 |
| 5,525,158 | 6/1996 | Tsukazaki et al. | 118/723 CB |

FOREIGN PATENT DOCUMENTS

| | | | |
|---|---|---|---|
| 52-65184 | 5/1977 | Japan | C23C 15/00 |
| 54-9592 | 4/1979 | Japan | C23C 13/00 |

*Primary Examiner*—Bernard Pianalto
*Attorney, Agent, or Firm*—Fitzpatrick, Cella, Harper & Scinto

[57] ABSTRACT

In formation of thin films on both surfaces of a substrate such as a lens or the like, a pair of cluster beam evaporation sources are provided in mutually separate manner in a film forming chamber. The substrate is disposed between the pair of cluster beam evaporation sources. The cluster beam evaporation source includes a crucible which is arranged to be inclined toward the substrate, or which has a nozzle on a lateral face opposed to the substrate.

15 Claims, 10 Drawing Sheets

FILM FORMING METHOD AND APPARATUS THEREFOR

This application is a continuation of application Ser. No. 08/356,468 filed Dec. 15, 1994, now abandoned.

BACKGROUND OF THE INVENTION

1. Field of the Invention

The present invention relates to a two-side film forming method for forming, for example, optical thin films on both faces of a substrate such as a lens, and an apparatus therefor.

2. Related Background Art

The optical thin film, such as antireflection film, is often formed on both sides of a substrate such as a lens, and there has widely been employed a method of forming the film on one side at a time, for example by resistance heating or electron gun heating. However such method requires a long time and involves the operation of inverting the substrate inside the vacuum chamber, and is, therefore, complex in the process itself and in the apparatus. For this reason there has been developed a method of simultaneously forming the films on both sides of the substrate by sputtering, as disclosed in the Japanese Patent Laid-Open Application No. 52-65184. This methods consists of positioning the substrate between at least a pair of targets provided in a vacuum chamber and depositing the particles, released from the surfaces of the targets onto both sides of the substrate, and is based on a fact that the direction of particle generation can be arbitrary, for example inclined or downward in case of sputtering, in contrast to the resistance heating or electron gun heating in which the generated particles are directed vertically upward.

Such simultaneous film forming on both sides of the substrate provides an additional advantage of avoiding thermal strain, since both faces of the substrate can be maintained free from temperature difference even if the substrate is heated for example by ion irradiation.

However, in the conventional method mentioned above, it is difficult to obtain an optical thin film of satisfactory optical characteristics particularly in the case of film forming with a fluoride, such as $MgF_2$ which is recently attracting particular attention as the material for the optical thin films. In the sputtering method, the material for thin film is once formed as a plate-shaped target and is evaporated by the impact of accelerated particles, however, the quality of the formed film is difficult to control in certain materials. For example, in case of forming an optical thin film containing $MgF_2$ etc., the sputtering method cannot provide a film of good quality with a low absorbance.

Also cluster ion beam evaporation method has been known for obtaining a thin film excellent in optical characteristics, adhesion and durability such as antiabrasion, without heating of the substrate to a high temperature.

FIG. 1 illustrates an ordinary apparatus for cluster ion beam evaporation, in which a closed crucible 131 is provided in a vacuum chamber 110, maintained at a predetermined reduced pressure by means of a vacuum pump, connected to an exhaust opening 111a. A material for thin film, contained in the closed crucible 131, is heated by a heating bombardment filament 132, and thus generated vapor is emitted, from a nozzle 131a of the closed crucible 131, into the vacuum atmosphere to form a cluster (clustered atoms). Then the clustered vapor (cluster particles) is irradiated with electron shower generated from an ionizing filament 133 to ionize at least a part of the cluster particles, and thus generated ions accelerated by an accelerating electrode 134 to irradiate a substrate $W_0$.

In such cluster ion beam evaporation, the vapor of the material for forming the thin film is deposited onto the substrate, in the form of a cluster particle, consisting of loose combination of a large number (usually more than 1,000) of atoms.

Such cluster ion beam evaporation has been employed in the film formation on one side of the substrate.

SUMMARY OF THE INVENTION

The present invention, attained in consideration of the above-mentioned drawbacks of the prior art, is to provide a two-side film forming method capable of forming a thin film of satisfactory quality, excellent in optical characteristics and durability, simultaneously on both sides of a substrate, and an apparatus therefor.

The above-mentioned object can be attained, according to the two-side film forming method of the present invention, by film formation under simultaneous irradiation of the two sides of the substrate respectively with cluster ion beams.

The film formation may also be conducted under simultaneous irradiation of the two sides of the substrate respectively with cluster beams without ionization.

The two-side film forming apparatus of the present invention is featured by a pair of cluster ion beam evaporation sources positioned in mutually separate manner in a film forming chamber, and substrate support means for supporting a substrate between said paired cluster ion beam evaporation sources.

The use of a cluster ion beam or a non-ionized cluster beam easily enables film formation on a vertical surface or a downward horizontal surface, whereby thin films excellent in durability or optical characteristics can be simultaneously formed on both sides of the substrate. In addition the quality of the formed thin film can be easily controlled, and an optical film of low absorbance can be obtained even in case of film formation with a fluoride such as $MgF_2$.

DETAILED DESCRIPTION OF THE PREFERRED EMBODIMENTS

Now the present invention will be clarified in detail by preferred embodiments thereof shown in the attached drawings.

Figure 1:
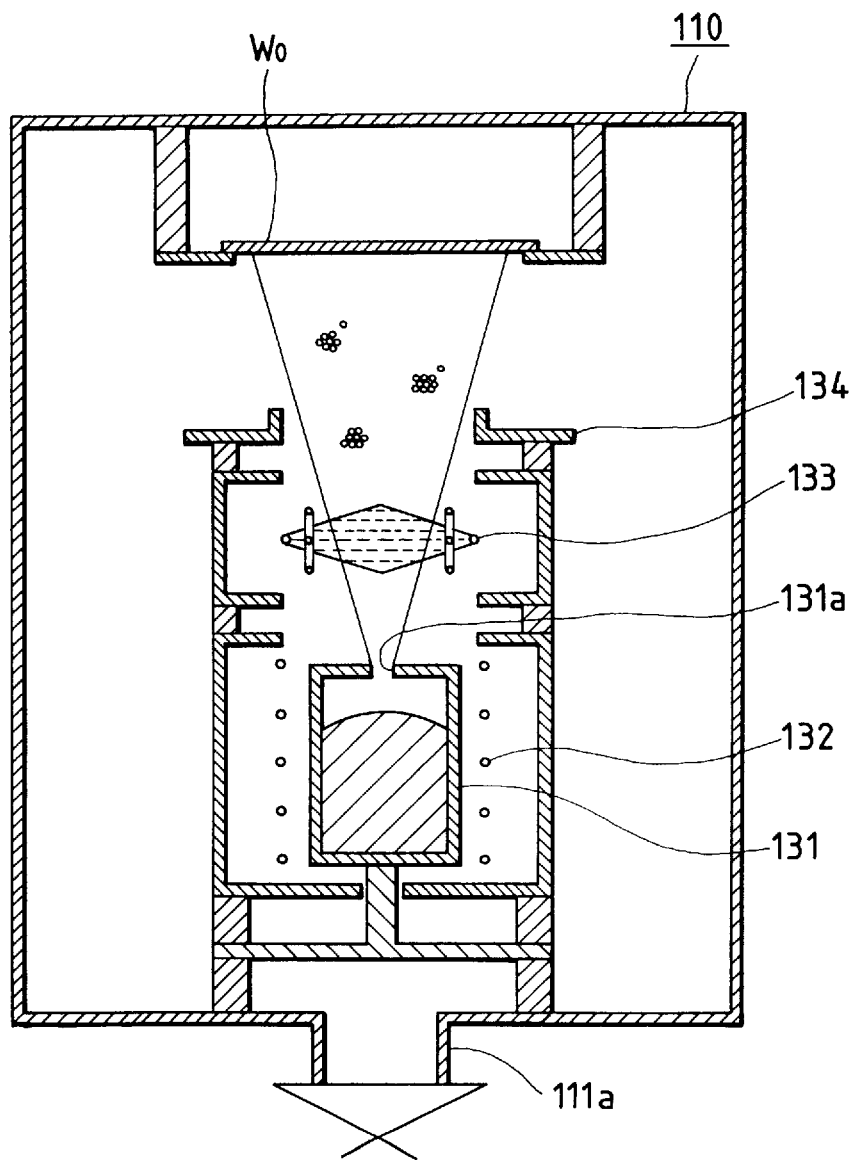
FIG. 1 is a schematic view of a cluster ion beam evaporation apparatus.
Figure 2:
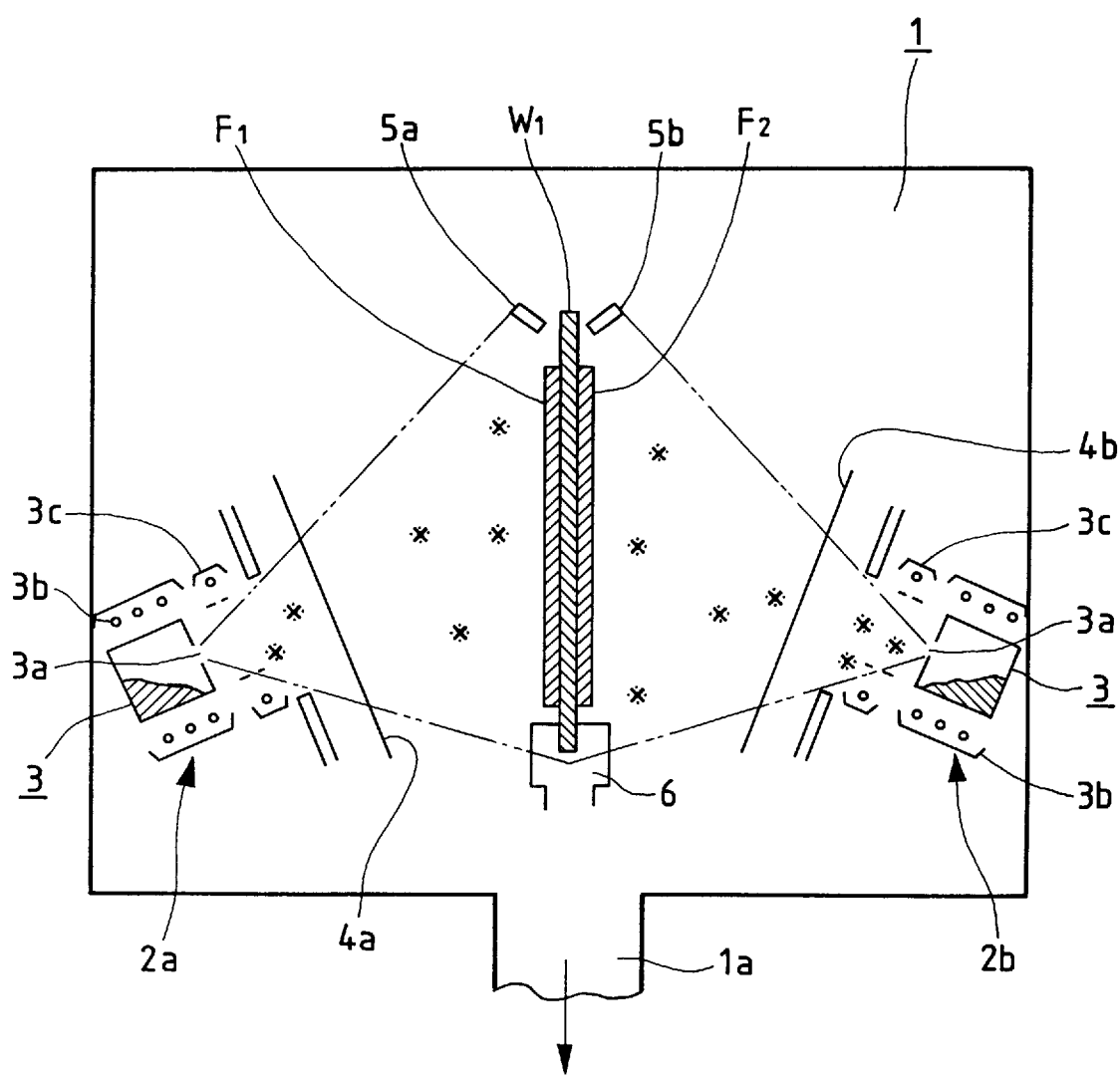
FIG. 2 is a schematic view of a two-side film forming apparatus constituting a first embodiment of the present invention.

FIG. 2 illustrates a two-side film forming apparatus employing cluster ion beams and constituting a first embodiment of the present invention, wherein a substrate $W_1$ is vertically supported, by a substrate holder constituting substrate support means 6, at the center of a vacuum chamber 1 constituting a film forming chamber, which is evacuated to a predetermined level of vacuum by a vacuum pump connected to an exhaust opening 1a. In said vacuum chamber 1, $MgF_2$ cluster ion beam evaporation sources 2a, 2b are provided for irradiating the faces of the substrate $W_1$ and are composed of closed crucibles 3 with nozzles 3a, heaters 3b for heating the crucibles, and ionizing electrodes 3c for ionizing the cluster particles generated from the nozzles 3a.

Figure 3A:
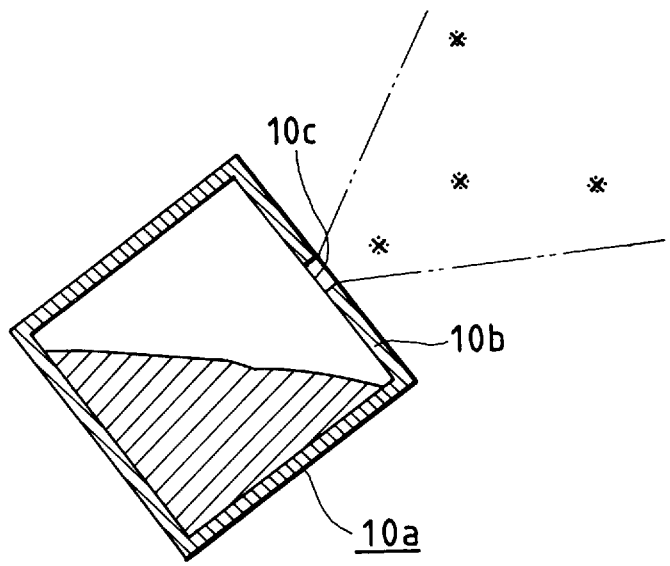
FIGS. 3A and 3B are schematic views of a closed crucible in the two-side film forming apparatus shown in FIG. 2, respectively showing an inclined state and a vertical state of said crucible.
Figure 3B:
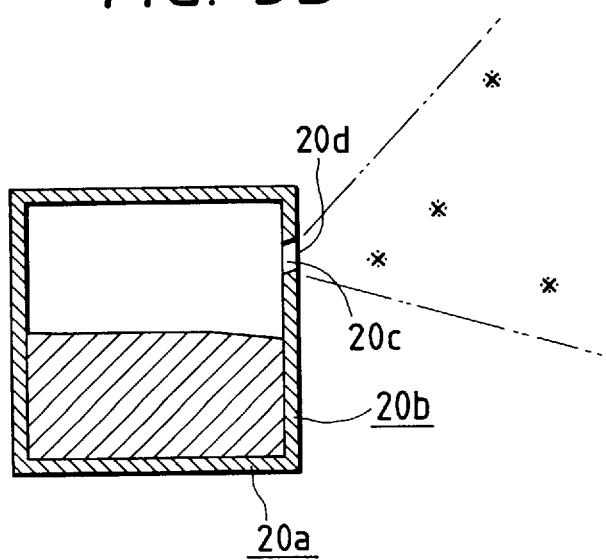

Each closed crucible 3 may be composed, as shown in FIG. 3A, of a closed cylindrical container 10a with an aperture 10c on a top wall 10b, inclined with a predetermined angle with respect to the substrate $W_1$, or, as shown in FIG. 3B, of a closed cylindrical container 20a with an aperture 20c on a lateral wall 20b facing the substrate $W_1$, in which the peripheral wall 20d of the aperture 20c is inclined at a predetermined angle. In the vicinity of the $MgF_2$ cluster ion beam evaporation sources 2a, 2b, there are provided shutters 4a, 4b for arbitrarily intercepting the cluster ion beams generated from said evaporation sources, and the film forming speeds of optical films $F_1$, $F_2$ formed on respective faces of the substrate $W_1$ are individually detected by crystal monitors 5a, 5b, constituting film forming speed measuring means, provided in the vicinity of the external periphery of the substrate $W_1$.

In the two-side film forming apparatus shown in FIG. 2, $MgF_2$ optical thin films of a thickness of 100 nm were formed on a BK glass substrate of a diameter of 200 mm. During the film formation, there were employed an accelerating voltage of 300 V for the cluster ion beams, an ionizing current of 200 mA, and a film forming speed of 1 nm/sec.

The obtained fluoride optical thin film, consisting of $MgF_2$, showed an absorbance not exceeding 0.1% at a wavelength of 400 nm, in the measurement of spectral absorbance. Also the variation in flatness of the substrate $W_1$, measured with a laser interferometer, was $\lambda/10$ at maximum, wherein $\lambda$ is the wavelength of He—Ne laser, and this result is presumably derived from a fact that the thermal strain of the substrate during film formation is extremely small. Satisfactory results were also obtained in the adhesion measured by a tape test, and the antiabrasive resistance utilizing silbon paper under a load of 2 kgf.

For the purpose of comparison, similar $MgF_2$ optical films were formed, one at a time on a side, on a similar substrate, utilizing the two-side film forming apparatus shown in FIG. 2, and the variation of the flatness of the substrate in this case was $\lambda/5$ to $\lambda/6$. The temperature rise of the substrate at the end of film formation, measured with a thermocouple, was 52° C.

The present embodiment enables formation of satisfactory $MgF_2$ optical film of an extremely low absorbance, simultaneously on both faces of the substrate, without danger of significant deterioration of the flatness of the substrate by the thermal strain during the film formation. Consequently optical thin films of satisfactory quality can be produced extremely inexpensively.

Figure 4:
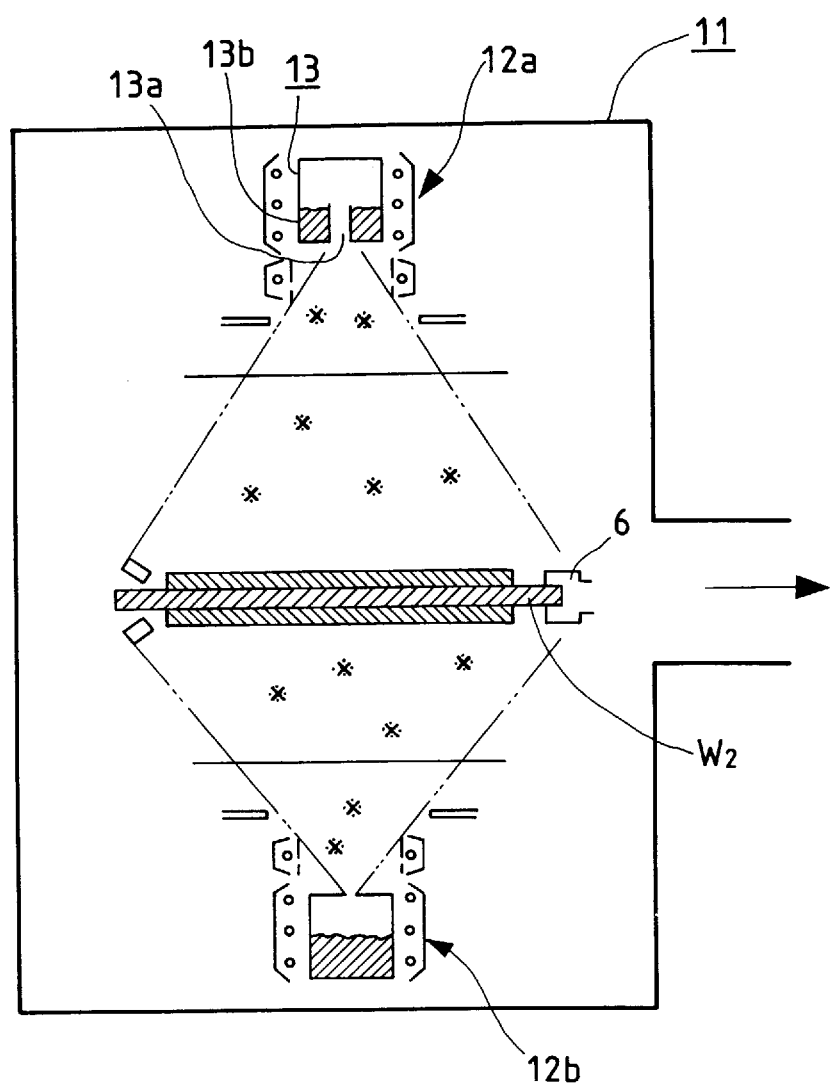
FIG. 4 is a schematic view of a variation of the first embodiment.

It is also possible, as shown in FIG. 4, to hold the substrate $W_2$ horizontally in the vacuum chamber 11 and to position the $MgF_2$ cluster ion beam evaporation sources 12a, 12b above and below the substrate $W_2$. In the upper cluster ion beam evaporation source 12a, the closed crucible 13 is provided, on the bottom face thereof, with a nozzle 13a and a liquid reservoir 13b (cf. Japanese Patent Publication No. 54-9592), while, in the lower evaporation source 12b, the crucible shown in FIG. 3A is positioned vertically.

Figure 5:
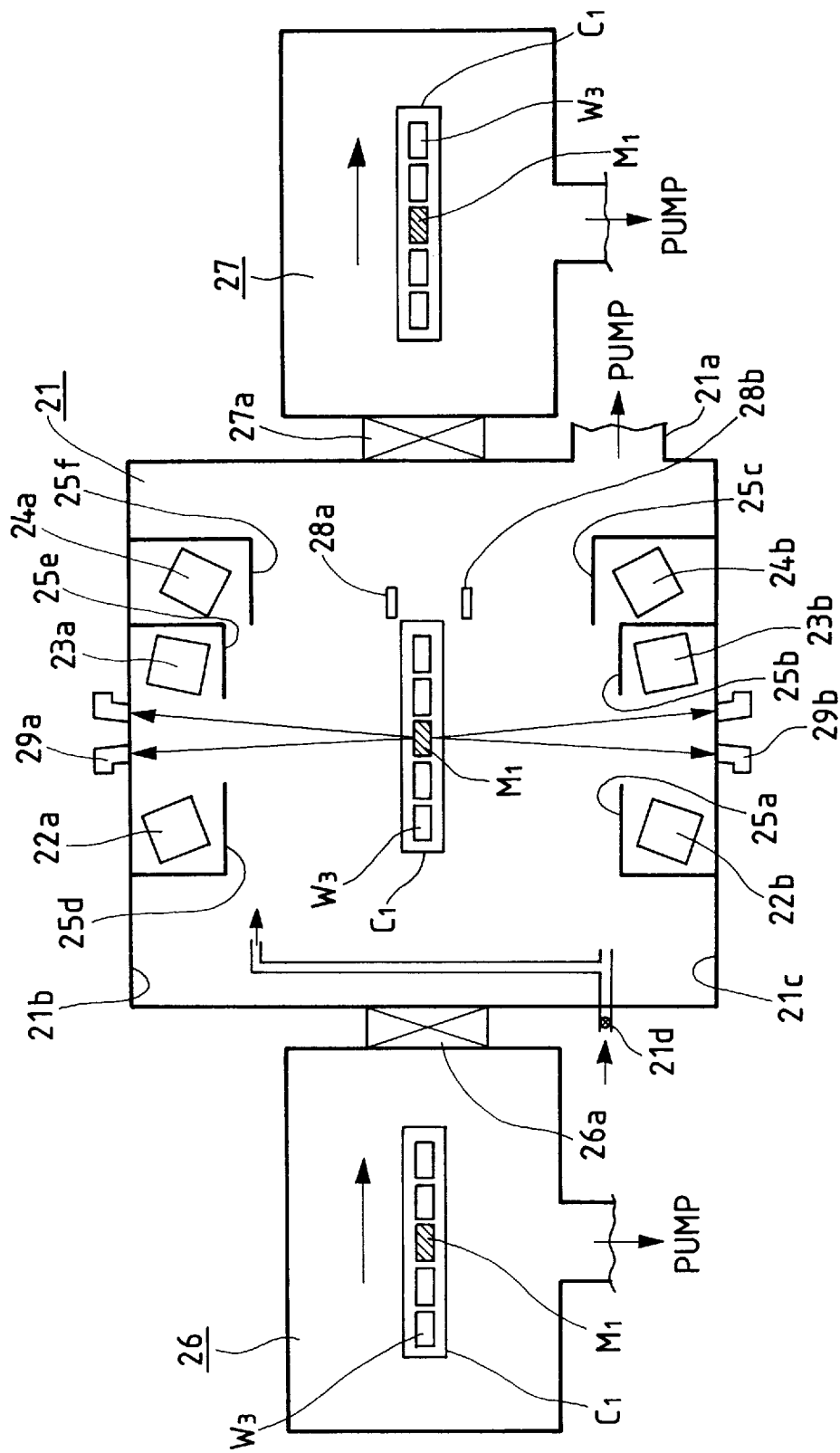
FIG. 5 is a schematic view of a two-side film forming apparatus constituting a second embodiment.

FIG. 5 illustrates a two-side film forming apparatus employing cluster ion beams and constituting a second embodiment of the present invention, wherein provided are a vacuum chamber 21 constituting a film forming chamber, to be evacuated by an exhaust opening 21a; a $LaF_3$ cluster ion beam evaporation source 22a, a Zr cluster ion beam evaporation source 23a and a $MgF_2$ cluster ion beam evaporation source 24a supported on the ceiling 21b of the vacuum chamber 21 and similar evaporation sources 22b, 23b, 24b supported on the bottom wall 21c of the vacuum chamber 21; and shutters 25a–25f capable of respectively intercepting the cluster ion beams generated from these cluster ion beam evaporation sources. The vacuum chamber 21 is provided with a gas supply line 21d as reaction gas introduction means for introducing oxygen gas into the vacuum chamber 21. On both sides of the vacuum chamber 1 there are provided load lock chambers 26, 27 which can be individually evacuated and which are in communication with the vacuum chamber 21 through gas valves 26a, 27a.

A substrate carrier $C_1$ supporting plural substrates $W_3$ is provided with a monitor glass $M_1$ at the center in the horizontal direction, and is loaded, through an unrepresented opening, into a load lock chamber 26. After the evacuation of the interior of the load lock chamber 26, the gate valve 26a is opened and the substrate carrier $C_1$ is transported into the vacuum chamber 21. The film forming speeds of the cluster ion beams generated toward both faces of the substrates $W_3$ are monitored by a pair of crystal monitors 28a, 28b, and the thicknesses of the optical films formed on both sides of the monitor glass $M_1$ are monitored by a pair of optical monitors 29a, 29b. After the film formation, the gate valve 27a of the other load lock chamber 27 is opened, and the substrate carrier $C_1$ is transported into the load lock chamber 27. Then, after the gate valve 27a is closed, the load lock chamber 27 is opened to the external atmosphere and the substrate carrier $C_1$ is taken out.

Figure 6A:
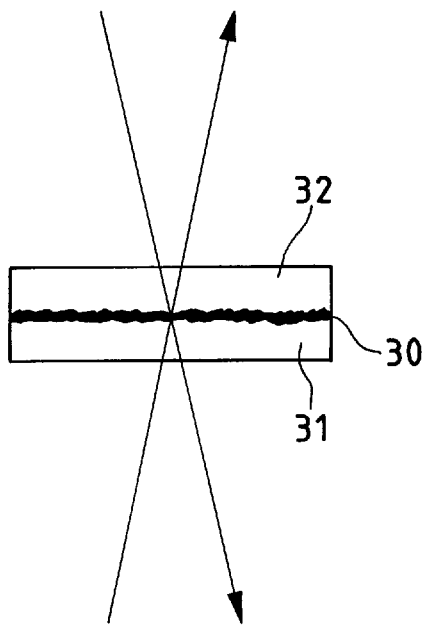
FIGS. 6A and 6B are schematic cross-sectional views of a monitor glass employed in the second embodiment, respectively showing different examples.
Figure 6B:
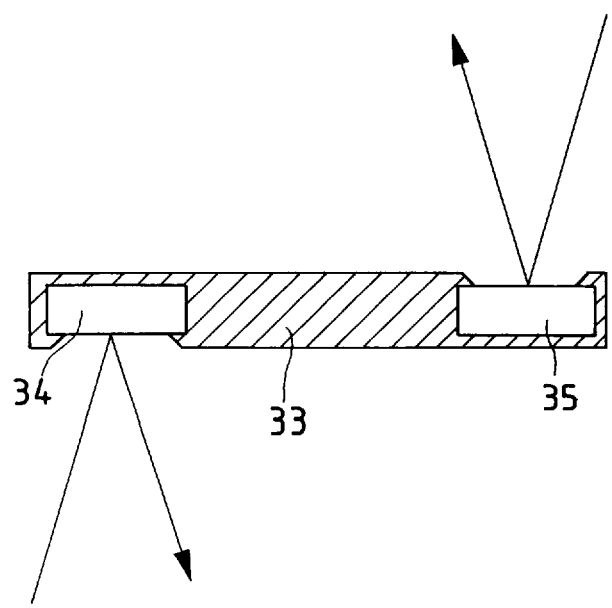

The above-mentioned monitor glass $M_1$ may be composed, as shown in FIG. 6A, of a pair of glass plates 31, 32 mutually adhered to sandwich an opaque non-reflective film 30 therebetween, or, as shown in FIG. 6B, of glass plates 34, 35 supported on both faces of an opaque non-reflective support member 33.

Figure 7:
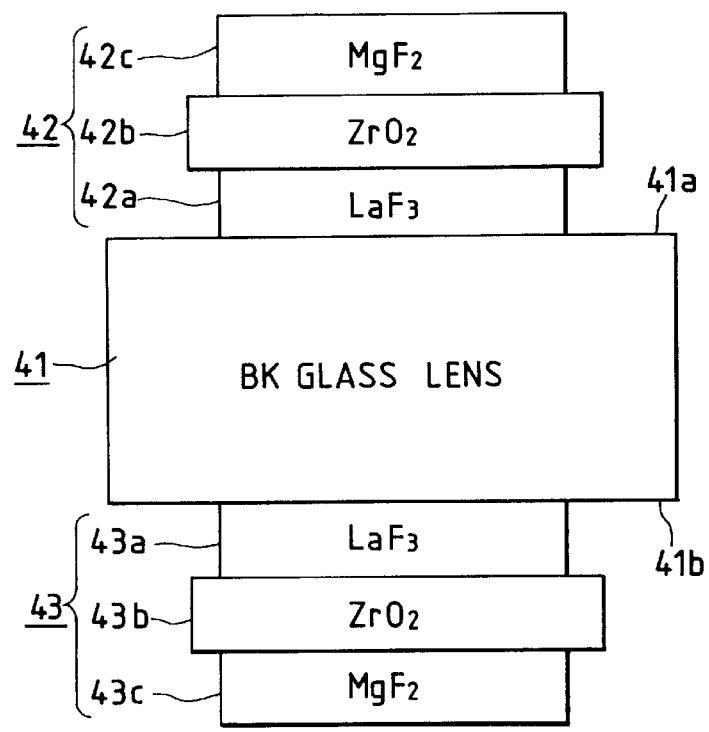
FIG. 7 is a schematic cross-sectional view of three-layered antireflection films obtained in the second embodiment.

With the two-side film forming apparatus shown in FIG. 5, there were formed, on both faces 41a, 41b of a BK glass lens substrate 41 of a diameter of 40 mm and a thickness of 1 mm as shown in FIG. 7, three-layered antireflections films 42, 43 consisting of first layers 42a, 43a of $LaF_3$ of an optical thickness of 122 nm, second layers of $ZrO_2$ of an optical thickness of 245 nm, and third layers of $MgF_2$ of an optical thickness of 122 nm. The first layers 42a, 43a were formed by deposition of the cluster ion beams generated from the $LaF_3$ cluster ion beam evaporation sources 22a, 22b under the conditions of an accelerating voltage of 500 V, an ionizing voltage of 300 V, an ionizing current of 200 mA and a film forming speed of 1 nm/sec. The second layers 42b, 43b were formed by reacting the cluster ion beams generated from the Zr cluster ion beam evaporation sources 23a, 23b with oxygen gas introduced from the gas supply line 21d, under the conditions of an accelerating voltage of 1 kV, an ionizing voltage of 300 V, an ionizing current of 300 mA and a film forming speed of 0.3 nm/sec. The third layers 42c, 43c were formed with the $MgF_2$ cluster ion beam evaporation sources 24a, 24b under the conditions of an accelerating voltage of 1 kV, an ionizing voltage of 300 V, an ionizing current of 200 mA and a film forming speed of 1 nm/sec.

Figure 8:
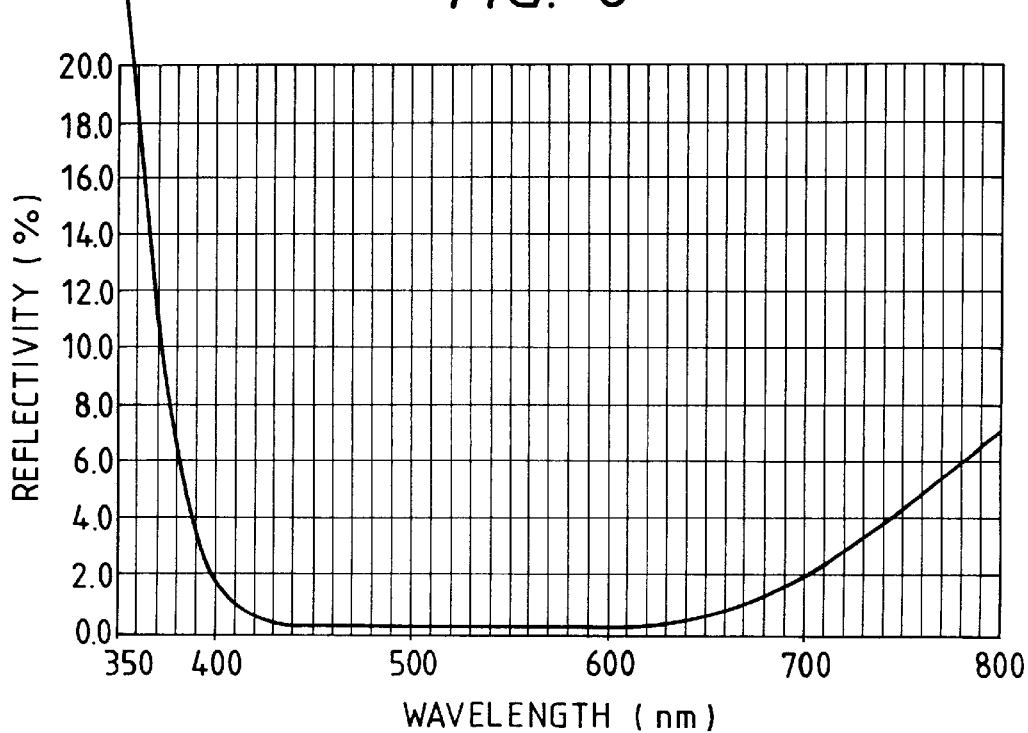
FIG. 8 is a chart showing the spectral reflectivity of the three-layered antireflection film formed by the second embodiment.

The spectral reflectivity of the BK glass lens, provided with thus formed three-layered antireflection films did not exceed 1% over the entire visible range as shown in FIG. 8, so that the above-mentioned three-layered films were identified as extremely good antireflective films. Also the adhesion and the abrasion resistance, measured in the same manner as in the first embodiment, were found to be extremely satisfactory.

The present embodiment can further improve the productivity, thereby reducing the production cost, as the time required for loading the substrates into the vacuum chamber and extracting the substrates therefrom can be significantly reduced. In case of simultaneous film formation on plural substrates as explained above, it is desirable to provide a mask, for partially intercepting the cluster ion beam, between each cluster ion beam evaporation source and the substrate, in order to avoid uneven thickness of the optical films formed on the substrates. Other aspects of this embodiment will not be explained as they are similar to those in the first embodiment.

Figure 9:
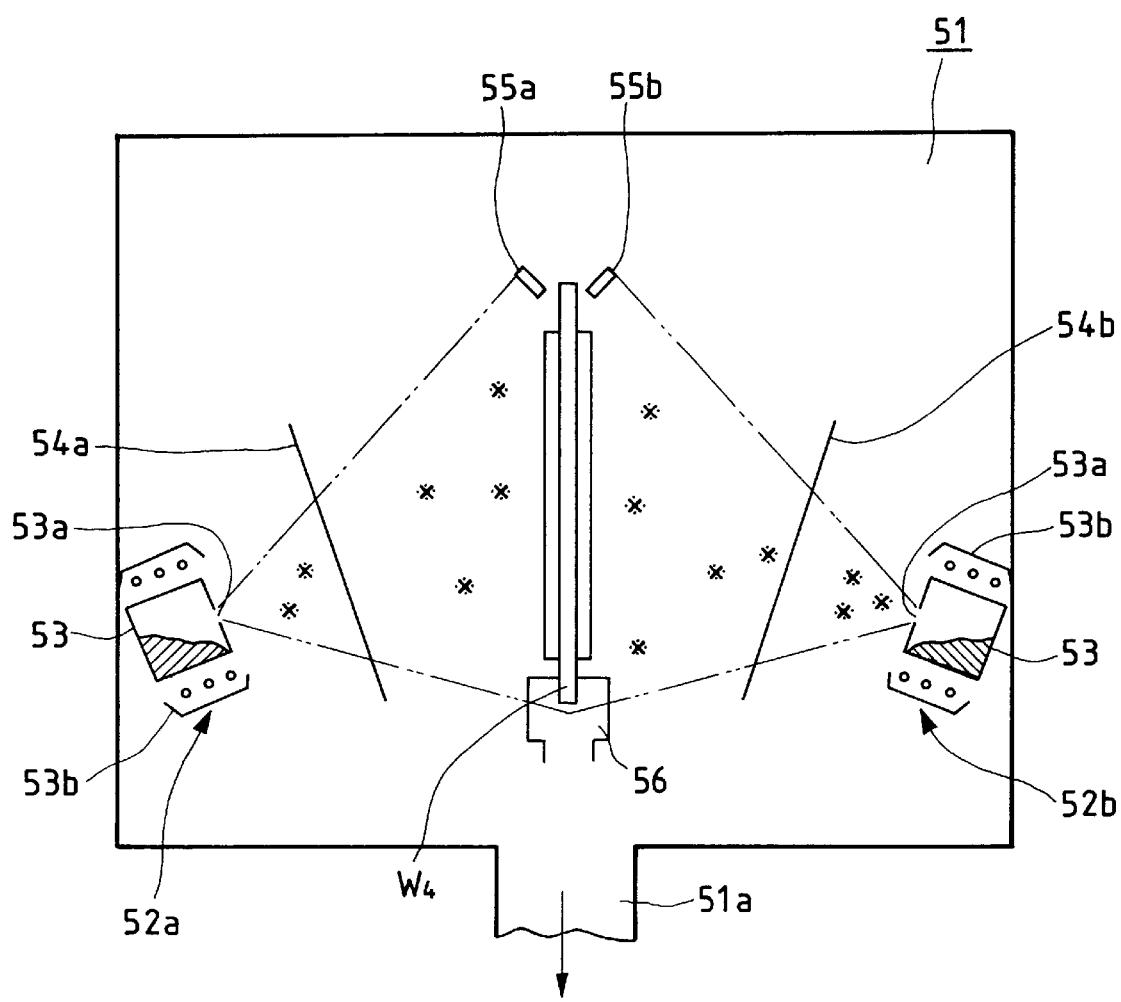
FIG. 9 is a schematic view of a two-side film forming apparatus constituting a third embodiment.

FIG. 9 illustrates a two-side film forming apparatus employing non-ionized cluster beams and constituting a third embodiment of the present invention, wherein a substrate $W_4$ is vertically supported, by a substrate holder 56 constituting substrate support means, at the center of a vacuum chamber 51 constituting a film forming chamber, which is evacuated to a predetermined level of vacuum by means of a vacuum pump connected to an exhaust opening 51a. In the vacuum chamber 51 there are provided $MgF_2$ cluster beam evaporation sources 52a, 52b which serve to irradiate the faces of the substrate $W_4$ with non-ionized cluster beams, and which are composed of closed crusibles 53 with nozzles 53a and heaters 53b for heating said crucibles. Each closed crucible 53 may be composed, as shown in FIG. 3A, of a closed cylindrical container inclined with a predetermined angle toward the substrate $W_4$, or as, shown in FIG. 3B, of a closed container with an aperture of which peripheral wall is inclined at a predetermined angle. In the vicinity of the $MgF_2$ cluster beam evaporation sources 52a, 52b there are provided shutters 54a, 54b for intercepting the cluster beams generated therefrom, and the film forming speed of the optical films formed on both faces of the substrate $W_4$ are detected by crystal monitors 55a, 55b provided in the vicinity of the external periphery of the substrate $W_4$.

With the two-side film forming apparatus shown in FIG. 9, $MgF_2$ optical films of a thickness of 100 nm were formed on both sides of a BK glass substrate of a thickness of 1 mm, under the conditions of a pressure of $5 \times 10^{-6}$ Torr in the vacuum chamber 51 and a film forming speed of 1 nm/sec.

Figure 10:
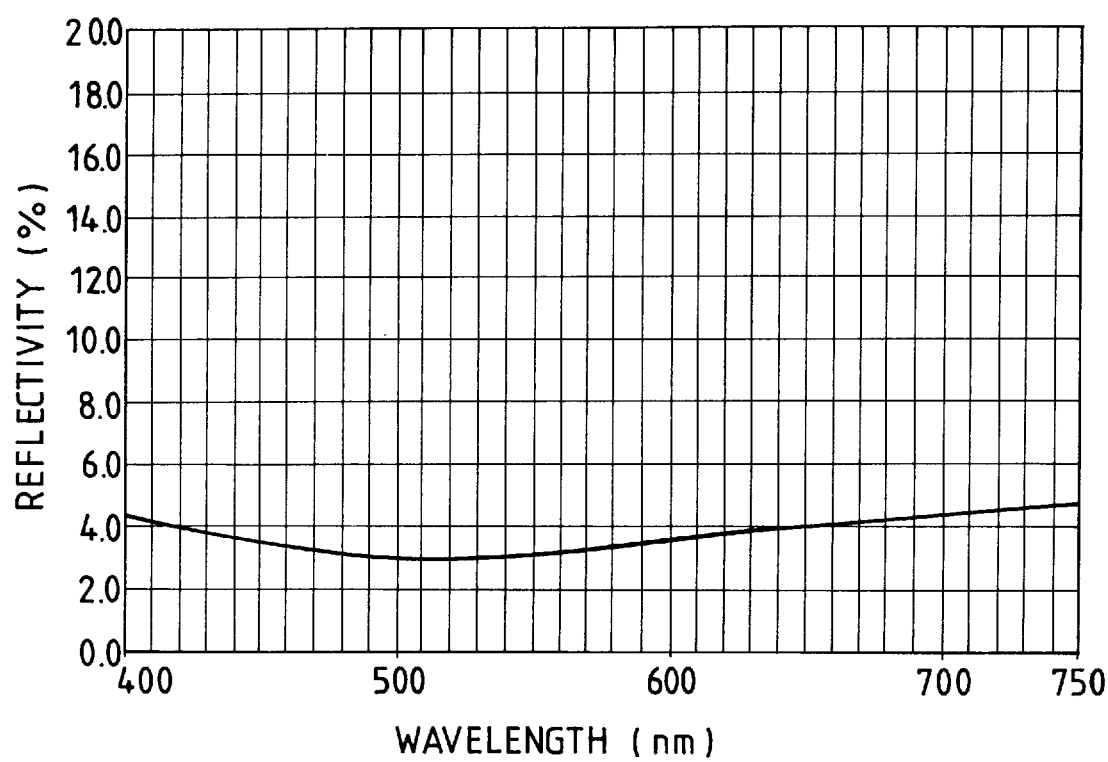
FIG. 10 is a chart showing the spectral reflectivity of an optical thin film formed by the third embodiment.

Thus formed fluoride optical film, consisting of $MgF_2$, showed an absorbance not exceeding 0.1% at 400 nm. Also satisfactory results were obtained in the adhesion tested in the known tape test, the abrasion resistance tested with silbon paper under a load of 1 kgf, and the solvent resistance to organic solvents, measured immediately after the film formation and after a high-temperature high-humidity durability test of 500 hours under a temperature of 70° C. and a humidity of 85%. Also the spectral reflectivity immediately after the film formation was as shown in FIG. 10, and the wavelength shift of the reflectivity after the high-temperature high-humidity durability test was less than 1 nm.

The present embodiment, in which the cluster beams generated from the cluster beam evaporation sources are deposited onto the substrate without ionization, is featured by a smaller temperature rise of the substrate in comparison with the case of employing the ionized cluster beams, and is also free from the damage of the substrate surfaces resulting from the impact of ions. Besides the apparatus can be simplified since the neutralizers, etc. can be dispensed with for avoiding abnormal discharge on the substrate. Other aspects of the present embodiment will not be explained as they are similar to those of the first embodiment.

Figure 11:
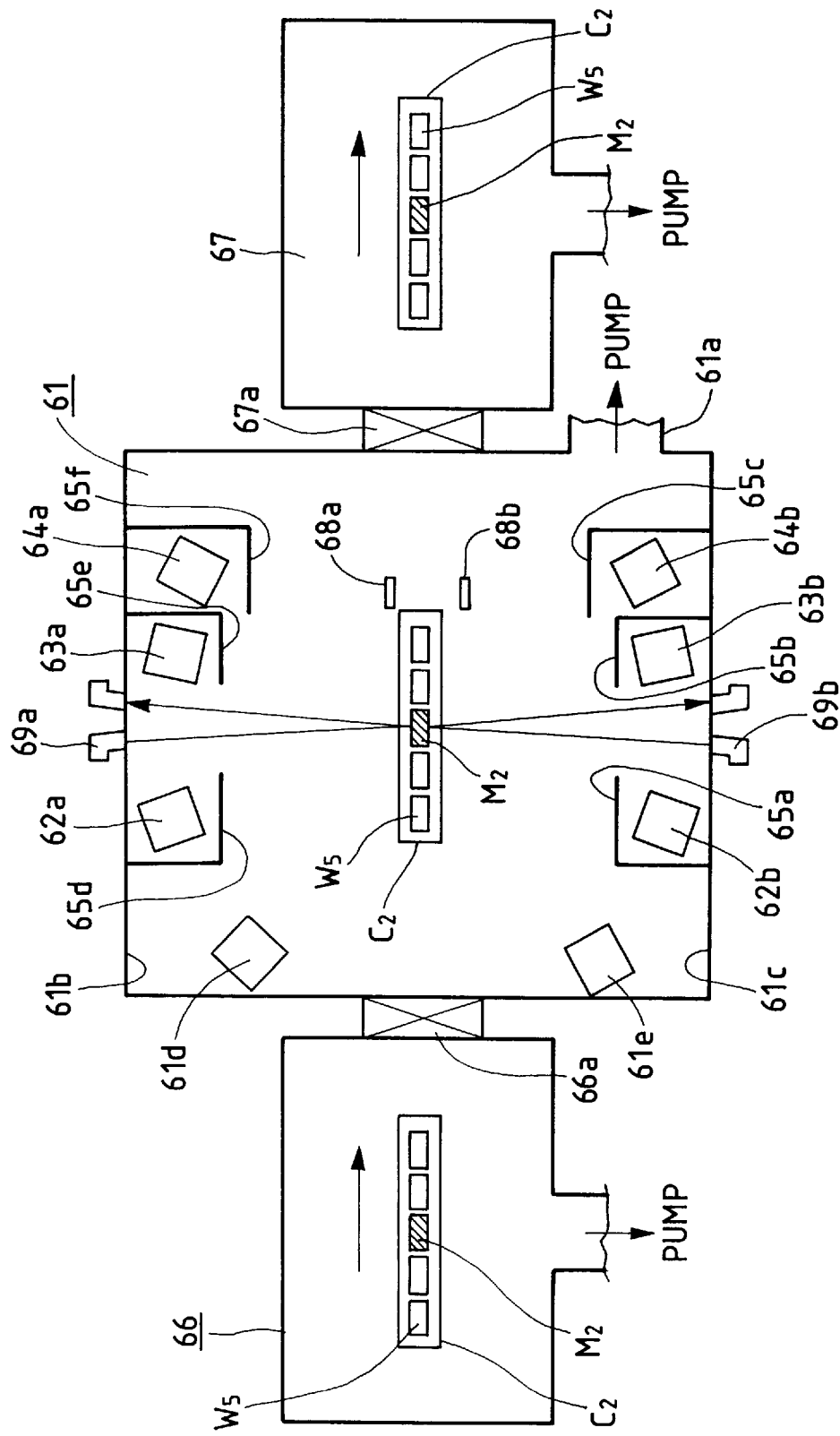
FIG. 11 is a schematic view of a two-side film forming apparatus constituting a fourth embodiment.

FIG. 11 illustrates a two-side film forming apparatus employing non-ionized cluster beams and constituting a fourth embodiment of the present invention, wherein provided are a vacuum chamber 61 constituting a film forming chamber to be evacuated from an exhaust opening 61a; a $LaF_3$ cluster beam evaporation source 62a, a Zr cluster beam evaporation source 63a and a $MgF_2$ cluster beam evaporation source 64a supported on the ceiling 61b of the vacuum chamber 61 and similar evaporation sources 62b, 63b, 64b supported on the bottom wall 61c of the vacuum chamber 61; and shutters 65a–65f capable of respectively intercepting the cluster beams generated from said cluster beam evaporation sources. In the vacuum chamber 61 there are provided oxygen ion sources 61d, 61e, constituting ionizing means for irradiating a substrate $W_5$ with oxygen gas ions constituting reactive gas ions. On both sides of the vacuum chamber 61 there are provided load lock chambers 66, 67 which are connected to the vacuum chamber 61 through gate valves 66a, 67a and which can be individually evacuated.

A substrate carrier $C_2$ supporting plural substrates $W_5$ is provided with a monitor glass $M_2$ at the center thereof in the horizontal direction, and is loaded, through an unrepresented opening, into a load lock chamber 66. After the evacuation of the interior of the load lock chamber 66, the gate valve 66a is opened and the substrate carrier $C_2$ is transported into the vacuum chamber 61. The film forming speeds of the cluster beams generated toward the faces of the substrates $W_5$ are detected by a pair of crystal monitors 68a, 68b, and the thicknesses of the optical film formed on both faces of the monitor glass $M_2$ are monitored by a pair of optical monitors 69a, 69b constituting the film thickness monitor means. After the film formation the gate value 67a of the other load lock chamber 67 is opened, and the substrate carrier $C_2$ is transferred to the load lock chamber 67. After the gate valve 67a is closed, the load lock chamber 67 is opened to the external atmosphere, and the substrate carrier $C_2$ is taken out.

With the two-side film forming apparatus shown in FIG. 11, there were formed, on both sides of a BK glass substrate of a diameter of 30 mm and a thickness of 2 mm, three-layered antireflection films consisting, as in the second embodiment, of first $LaF_3$ layers, second $ZrO_2$ layers and third $MgF_2$ layers. The first layers were formed by the cluster beams generated from the $LaF_3$ cluster beam evaporation sources 62a, 62b under the conditions of a film forming speed of 0.6 nm/sec and a film forming pressure of $4 \times 10^{-6}$ Torr. The second layers were formed by reacting the cluster beams, generated from the Zr cluster beam evaporation sources 63a, 63b with oxygen gas ions irradiated from the oxygen ion sources 61d, 61e under the conditions of a film forming speed of 0.2 nm/sec., and oxygen ion energy of 200 eV, and a current density of 40 $\mu$A/cm$^2$. The third layers were formed with the MgF$_2$ cluster beam evaporations sources 64a, 64b under the conditions of a film forming speed of 1 nm/sec and a film forming pressure of $5 \times 10^{-6}$ Torr.

The spectral reflectivity of thus formed three-layered antireflection film did not exceed 1% over the entire visible range, so that the three-layered film proved to be an extremely good antireflection film. Also extremely satisfactory results were obtained in the measurement of the adhesion and the abrasion resistance as in the first embodiment.

The two-side film forming method of the present invention is executed in the following manner.

The two sides of the substrate W$_1$, supported vertically in the vacuum chamber 1, are irradiated with the cluster ion beams generated from the MgF$_2$ cluster ion beams, whereby the MgF$_2$ optical films F$_1$, F$_2$ are simultaneously formed. The cluster ion beam can easily achieve film formation even in inclined irradiation or vertically downward irradiation. Also optical films of satisfactory quality, excellent in optical characteristics and durability can be obtained even from fluorides such as MgF$_2$. Similar effects can be attained also employing the cluster beams, instead of the cluster ion beams.

Examples of fluoride employable for forming the optical film in the film forming method of the present invention include MgF$_2$, LaF$_3$, LiF, NdF$_3$, BaF$_2$, SrF$_2$, NaF, AlF$_3$, BiF$_2$, CaF$_2$, PbF$_2$, CeF$_3$ and Na$_3$AlF$_6$.

The present invention, constructed as explained in the foregoing, can provide the following advantages.

There can be formed thin films of satisfactory quality, excellent in the optical characteristics and the durability, simultaneously on both sides of the substrate. As a result, there can be significantly reduced the film forming time in case of film formation on both sides of the substrate, and the film forming process and the film forming apparatus can be greatly simplified as the substrate inverting step can be dispensed with. Also, optical films of low absorbance and satisfactory optical characteristics can be obtained even from fluorides.

What is claimed is:

1. A film forming method comprising the steps of:
   holding a substrate at substantially center of a film forming chamber;
   providing a pair of cluster ion beam generating means at positions to be symmetrical with respect to the substrate;
   radiating cluster ion beams from the pair of cluster ion beam generating means to form a thin film on both sides of the substrate, each said thin film including a fluoride layer;
   individually measuring the film forming speed of the film formed on each side of said substrate, and
   individually monitoring the thickness of the film formed on each side of said substrate.

2. A film forming method according to claim 1, wherein said fluoride is MgF$_2$, LaF$_3$, LiF, NdF$_3$, BaF$_2$, SrF$_2$, NaF, AlF$_3$, BiF$_2$, CaF$_2$, PbF$_2$, CeF$_3$ or Na$_3$AlF$_6$.

3. A film forming method comprising the steps of:
   holding a substrate at substantially center of a film forming chamber;
   providing a pair of cluster beam generating means at positions to be symmetrical with respect to the substrate;
   radiating cluster beams from the pair of cluster beam generating means to form a thin film on both sides of the substrate; each said thin film including a fluoride layer;
   individually measuring the film forming speed of the film formed on each side of said substrate, and
   individually monitoring the thickness of the film formed on each side of said substrate.

4. A film forming method according to claim 3, wherein said fluoride is MgF$_2$, LaF$_3$, LiF, NdF$_3$, BaF$_2$, SrF$_2$, NaF, AlF$_3$, BiF$_2$, CaF$_2$, PbF$_2$, CeF$_3$ or Na$_3$AlF$_6$.

5. A film forming apparatus comprising:
   a pair of cluster ion beam evaporation sources provided in mutually separate manner in a film forming chamber;
   substrate support means for supporting a substrate between said paired cluster ion beam evaporation sources, said substrate adapted to receive a thin film on each side of the substrate, each said thin film including a fluoride layer;
   film forming speed measurement means for individually measuring the film forming speed of the film formed on each side of said substrate, and
   film thickness monitor means for individually monitoring the thickness of the film formed on each side of said substrate.

6. A film forming apparatus according to claim 5, further comprising:
   reaction gas introduction means for introducing reaction gas into said film forming chamber.

7. A film forming apparatus according to claim 5, further comprising:
   at least a load lock chamber connected to said film forming chamber through a gate value.

8. A film forming apparatus according to claim 5, wherein each of said paired cluster ion beam evaporation sources includes a closed crucible inclined toward said substrate.

9. A film forming apparatus according to claim 5, wherein each of said paired cluster ion beam evaporation sources includes a closed crucible provided with a nozzle on a lateral face opposed to said substrate.

10. A film forming apparatus comprising:
    a pair of cluster beam evaporation sources provided in mutually separate manner in a film forming chamber;
    substrate support means for supporting a substrate between said paired cluster beam evaporation sources said substrate adapted to receive a thin film on each side of the substrate, each said thin film including a fluoride layer;
    film forming speed measurement means for individually measuring the film forming speed of the film formed on each side of said substrate, and
    film thickness monitor means for individually monitoring the thickness of the film formed on each side of said substrate.

11. A film forming apparatus according to claim 10, further comprising:
    ionization means for ionizing said reaction gas.

12. A film forming apparatus according to claim 10, further comprising:

reaction gas introduction means for introducing reaction gas into said film forming chamber.

13. A film forming apparatus according to claim 10, further comprising:

at least a load lock chamber connected to said film forming chamber through a gate valve.

14. A film forming apparatus according to claim 10, wherein each of said paired cluster beam evaporation sources includes a closed crucible provided with a nozzle on a lateral face opposed to said substrate.

15. A film forming apparatus according to claim 10, wherein each of said paired cluster beam evaporation sources includes a closed crucible inclined toward said substrate.

* * * * *